(12) United States Patent
Hsu et al.

(10) Patent No.: US 12,323,141 B2
(45) Date of Patent: Jun. 3, 2025

(54) LEVEL SHIFTER

(71) Applicant: MEDIATEK INC., Hsinchu (TW)

(72) Inventors: Hsin-Cheng Hsu, Hsinchu (TW); Federico Agustin Altolaguirre, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 156 days.

(21) Appl. No.: 18/310,699

(22) Filed: May 2, 2023

(65) Prior Publication Data

US 2023/0268925 A1    Aug. 24, 2023

Related U.S. Application Data

(63) Continuation-in-part of application No. 17/578,643, filed on Jan. 19, 2022, now Pat. No. 11,695,395.

(60) Provisional application No. 63/171,640, filed on Apr. 7, 2021.

(51) Int. Cl.
*H03K 3/356* (2006.01)
*H03K 19/0175* (2006.01)
*H03K 19/0185* (2006.01)

(52) U.S. Cl.
CPC .......... *H03K 19/018521* (2013.01); *H03K 3/356113* (2013.01)

(58) Field of Classification Search
None
See application file for complete search history.

(56) References Cited

U.S. PATENT DOCUMENTS 7,449,917 B2 * 11/2008 Cheon .......... H03K 19/018528
                                              326/62
8,324,880 B2  12/2012 Wang et al.
8,638,157 B2   1/2014 Duby et al.
(Continued)

FOREIGN PATENT DOCUMENTS

TW       201105014 A    2/2011
TW         I343185 B    6/2011
(Continued)

OTHER PUBLICATIONS

Extended European Search report dated Sep. 2, 2022, issued in application No. EP 22160493.7.
(Continued)

*Primary Examiner* — Kenneth B Wells
(74) *Attorney, Agent, or Firm* — McClure, Qualey & Rodack, LLP

(57) ABSTRACT

A level shifter with high reliability is shown, which has a power multiplexer receiving a plurality of power voltage candidates to selectively output a selected power voltage. In response to a low-to-high transition of the input signal of the level shifter, the first output terminal of the level shifter is pulled up to the selected power voltage by the second pull-up device, and the first pull-down device pulls down the second output terminal of the level shifter to a low-voltage level corresponding to the selected power voltage. In response to a high-to-low transition of the input signal, the second output terminal of the level shifter is pulled up to the selected power voltage by the first pull-up device, and the second pull-down device pulls down the first output terminal of the level shifter to the low-voltage level corresponding to the selected power voltage.

16 Claims, 6 Drawing Sheets

(56) References Cited

U.S. PATENT DOCUMENTS

| | | | |
|---|---|---|---|
| 9,985,643 B2 | 5/2018 | Kim | |
| 10,630,268 B2 | 4/2020 | Hsu et al. | |
| 11,128,300 B1 * | 9/2021 | Hanagami | H03K 19/215 |
| 2011/0018606 A1 | 1/2011 | Cassia | |
| 2011/0096068 A1 * | 4/2011 | Choi | H03K 19/018521 |
| | | | 327/333 |
| 2014/0132329 A1 | 5/2014 | Li | |
| 2015/0280714 A1 | 10/2015 | Kumar | |
| 2017/0272093 A1 | 9/2017 | Kim | |
| 2019/0379365 A1 | 12/2019 | Hsu et al. | |

FOREIGN PATENT DOCUMENTS

| | | |
|---|---|---|
| TW | 201251331 A | 12/2012 |
| TW | I496420 B | 8/2015 |
| TW | I681628 B | 1/2020 |

OTHER PUBLICATIONS

Chinese language office action dated Dec. 12, 2022, issued in application No. TW 111111226.

* cited by examiner

LEVEL SHIFTER

CROSS REFERENCE TO RELATED APPLICATIONS

This application is a Continuation-In-Part of pending U.S. patent application Ser. No. 17/578,643, filed on Jan. 19, 2022 and entitled "Level Shifter" (now U.S. Pat. No. 11,695, 395), which claims the benefit of U.S. Provisional Application No. 63/171,640, filed on Apr. 7, 2021, the entirety of which is incorporated by reference herein.

BACKGROUND OF THE INVENTION

Field of the Invention

The present invention relates to a level shifter.

Description of the Related Art

As the technology used in the semiconductor manufacturing process develops (e.g., scaling down to 5 nm, 4 nm, 3 nm, or below), the maximum applied voltage is suppressed (e.g., down to 1.2V, much lower than the 1.8V applied to the 7 nm products). If there are 7 nm chips as well as more advanced (5 nm/4 nm/3 nm or below) chips on the same printed circuit board (PCB), the power system should provide an overdriving design, e.g. transferring two different voltage levels VDDQ and 2VDDQ (e.g., 2VDDQ is 2.5V or 3.3V) into two different power pins VDIO0 and VDIO1. In this field, a level shifter is required. A level shifter having high reliability is called for.

BRIEF SUMMARY OF THE INVENTION

A level shifter in accordance with an exemplary embodiment of the present invention includes a power multiplexer, a pair of pull-up devices and a pair of pull-down devices. In response to a low-to-high transition of the input signal of the level shifter, the first output terminal of the level shifter is pulled up to the selected power voltage by the second pull-up device, and the first pull-down device pulls down the second output terminal of the level shifter to a low-voltage level corresponding to the selected power voltage. In response to a high-to-low transition of the input signal of the level shifter, the second output terminal of the level shifter is pulled up to the selected power voltage by the first pull-up device, and the second pull-down device pulls down the first output terminal of the level shifter to the low-voltage level corresponding to the selected power voltage. Each pull-down device includes a plurality of pull-down paths corresponding to the different power voltage candidates. In response to a selection made through the power multiplexer, a pull-down path corresponding to the selected power voltage in each pull-down device is turned on and the other pull-down paths are turned off. The level shifter is a multi-voltage level shifter.

In an exemplary embodiment, a first power voltage candidate is greater than a second power voltage candidate, and a first low-voltage level corresponding to the first power voltage candidate is greater than a second low-voltage level corresponding to the second power voltage candidate.

In an exemplary embodiment, the first pull-down device includes a first PMOS transistor, and the second pull-down device includes a second PMOS transistor. The first PMOS transistor has a source terminal coupled to the second output terminal of the level shifter. In response to the selected power voltage that is the first power voltage candidate, a drain terminal of the first PMOS transistor is coupled to the first low-voltage level. The second PMOS transistor has a source terminal coupled to the first output terminal of the level shifter. In response to the selected power voltage that is the first power voltage candidate, a drain terminal of the second PMOS transistor is coupled to the first low-voltage level.

In an exemplary embodiment, the first pull-down device further includes a third PMOS transistor, and the second pull-down device further includes a fourth PMOS transistor. The third PMOS transistor has a source terminal coupled to the second output terminal of the level shifter, and a drain terminal coupled to a gate terminal of the first PMOS transistor. The fourth PMOS transistor has a source terminal coupled to the first output terminal of the level shifter, and a drain terminal coupled to a gate terminal of the second PMOS transistor. In response to the selected power voltage that is the first power voltage candidate, a gate terminal of the third PMOS transistor and a gate terminal of the fourth PMOS transistor are coupled to the first low-voltage level.

In an exemplary embodiment, the first pull-down device further includes a first NMOS transistor and a second NMOS transistor, and the second pull-down device further includes a third NMOS transistor and a fourth NMOS transistor. The first NMOS transistor has a gate terminal receiving the input signal of the level shifter and a source terminal coupled to a ground level, and the second NMOS transistor has a source terminal coupled to a drain terminal of the first NMOS transistor and a drain terminal coupled to the gate terminal of the first PMOS transistor. The third NMOS transistor has a gate terminal receiving an inverted signal of the input signal of the level shifter and a source terminal coupled to the ground level, and the fourth NMOS transistor has a source terminal coupled to a drain terminal of the third NMOS transistor and a drain terminal coupled to the gate terminal of the second PMOS transistor. In response to the selected power voltage that is the first power voltage candidate, a gate terminal of the second NMOS transistor and a gate terminal of the fourth NMOS transistor are coupled to a high-voltage level of the input signal.

In an exemplary embodiment, in response to the selected power voltage that is the second power voltage candidate, the drain terminal of the first PMOS transistor and the drain terminal of the second PMOS transistor are coupled to the ground level, the gate terminal of the third PMOS transistor and the gate terminal of the fourth PMOS transistor are coupled to the second low-voltage level, and the gate terminal of the second NMOS transistor and the gate terminal of the fourth NMOS transistor are coupled to the ground level.

In an exemplary embodiment, the first pull-down device further includes a fifth NMOS transistor and a sixth NMOS transistor, and the second pull-down device further includes a seventh NMOS transistor and an eighth NMOS transistor. The fifth NMOS transistor has a gate terminal receiving the input signal and a source terminal coupled to the second low-voltage level, and the sixth NMOS transistor has a source terminal coupled to a drain terminal of the fifth NMOS transistor and a drain terminal coupled to the second output terminal of the level shifter. The seventh NMOS transistor has a gate terminal receiving the inverted signal of the input signal and a source terminal coupled to the second low-voltage level, and the eighth NMOS transistor has a source terminal coupled to a drain terminal of the seventh NMOS transistor and a drain terminal coupled to the first output terminal of the level shifter. In response to the selected power voltage that is the second power voltage candidate, a gate terminal of the sixth NMOS transistor and a gate terminal of the eighth NMOS transistor are coupled to the high-voltage level of the input signal.

In an exemplary embodiment, in response to the selected power voltage that is the first power voltage candidate, the gate terminal of the sixth NMOS transistor and the gate terminal of the eighth NMOS transistor are coupled to the second low-voltage level.

In an exemplary embodiment, the first pull-down device further includes a ninth NMOS transistor, and the second pull-down device further includes a tenth NMOS transistor. The ninth NMOS transistor has a source terminal coupled to the drain terminal of the sixth NMOS transistor, a drain terminal coupled to the second output terminal of the level shifter, and a gate terminal coupled to the first low-voltage level. The tenth NMOS transistor has a source terminal coupled to the drain terminal of the eighth NMOS transistor, a drain terminal coupled to the first output terminal of the level shifter, and a gate terminal coupled to the first low-voltage level.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
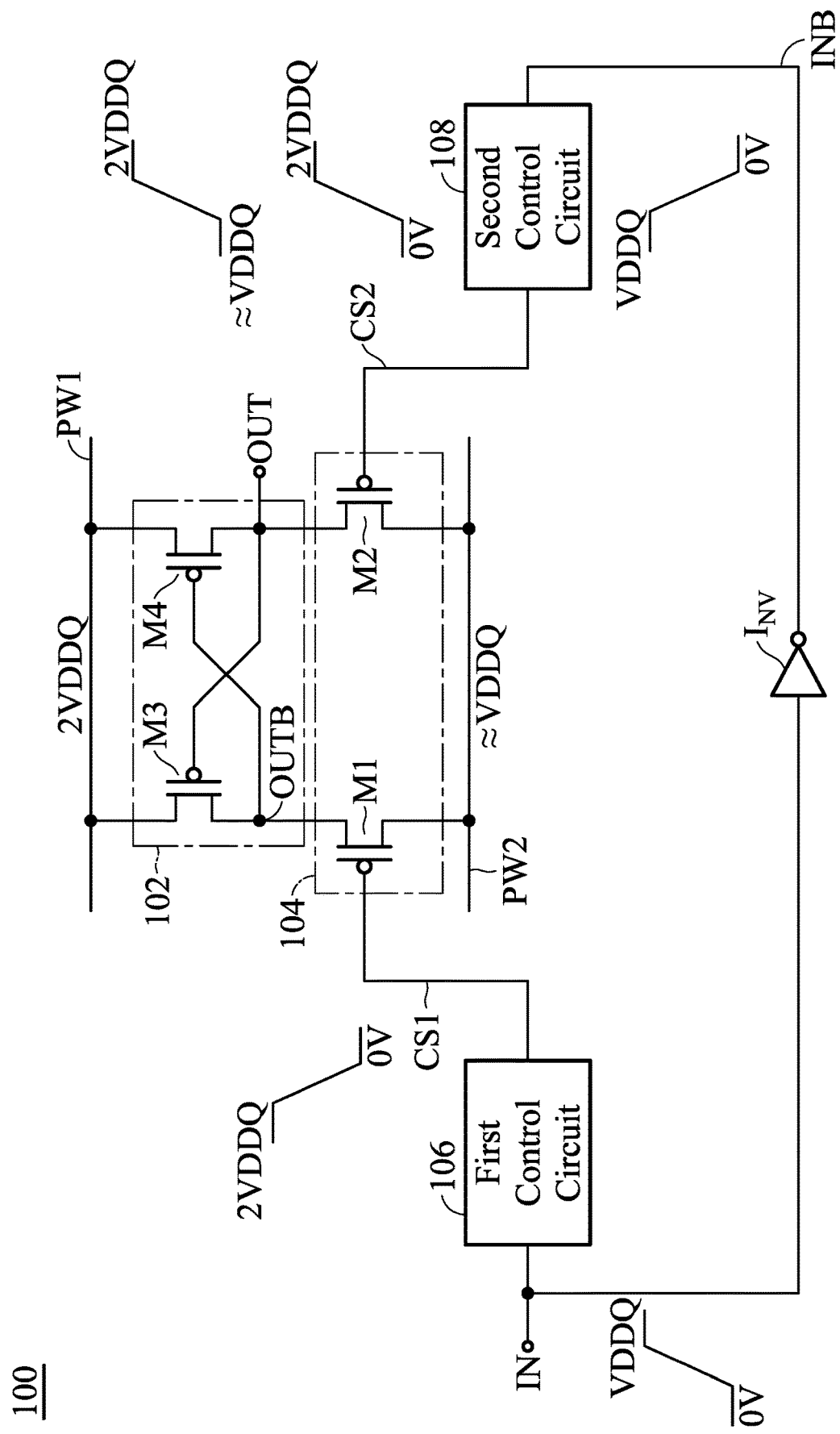
FIG. 1 illustrates a level shifter 100 in accordance with an exemplary embodiment of the present invention, which includes a cross-coupled pair 102, a pull-down pair 104, a first control circuit 106, an inverter Inv, and a second control circuit 108.

FIG. 1 illustrates a level shifter 100 in accordance with an exemplary embodiment of the present invention, which includes a cross-coupled pair 102, a pull-down pair 104, a first control circuit 106, an inverter Inv, and a second control circuit 108.

The cross-coupled pair 102 couples a first power terminal (illustrated as a power line PW1) to a first output terminal OUT of the level shifter 100 or a second output terminal OUTB of the level shifter 100. The pull-down pair 104 has a first transistor M1 and a second transistor M2, which are controlled according to an input signal IN of the level shifter 100. The first transistor M1 is coupled between the second output terminal OUTB and a second power terminal (illustrated as a power line PW2), and the second transistor M2 is coupled between the first output terminal OUT and the second power terminal PW2. A first voltage level (2VDDQ) coupled to the first power terminal PW1 is greater than a second voltage level (≈VDDQ) coupled to the second power terminal PW2, and the second voltage level (≈VDDQ) is greater than the ground level (0 volts). In this example, the first voltage level (2VDDQ) coupled to the first power terminal PW1 is an overdrive voltage. In another exemplary embodiment, the second voltage level equals a voltage level (VDDQ) of a power source applied to a former stage that provides the input signal IN to the level shifter 100.

As shown, an output signal (at the first output terminal OUT) shifted from the input signal IN operates between the second voltage level (~VDDQ) and the first voltage level (2VDDQ). Without the effect of the transistor threshold voltage Vt, the output duty does not depend on the manufacture process.

The first transistor M1 is a p-channel metal oxide semiconductor field-effect transistor (PMOS transistor) having a source coupled to the second output terminal OUTB, and a drain coupled to the second power terminal PW2. The second transistor M2 is a PMOS transistor having a source coupled to the first output terminal OUT, and a drain coupled to the second power terminal PW2. The cross-coupled pair 102 may have a third transistor M3 and a fourth transistor M4. The third transistor M3 is a PMOS transistor, having a source coupled to the first power terminal PW1, a drain coupled to the second output terminal OUTB, and a gate coupled to the first output terminal OUT. The fourth transistor M4 is a PMOS transistor, having a source coupled to the first power terminal PW1, a drain coupled to the first output terminal OUT, and a gate coupled to the second output terminal OUTB.

The first control circuit 106 receives the input signal IN and generates a first control signal CS1 to be coupled to the gate of the first transistor M1. The inverter Inv receives the input signal IN and generates an inverted input signal INB. The second control circuit 108 receives the inverted input signal INB and generates a second control signal CS2 to be coupled to the gate of the second transistor M2. The first control signal CS1 generated by the first control circuit 106 and the second control signal CS2 generated by the second control circuit 108 both operate between the ground level (0 volts) and the overdrive voltage (2VDDQ). The first control circuit 106 pulls up the first control signal CS1 when the input signal IN is low (0 volts), and pulls down the first control signal CS2 when the input signal IN is high (VDDQ). The second control circuit 108 pulls down the second control signal CS2 when the inverted input signal INB is high (VDDQ), and pulls up the second control signal CS2 when the inverted input signal INB is low (0 volts).

Figure 2:
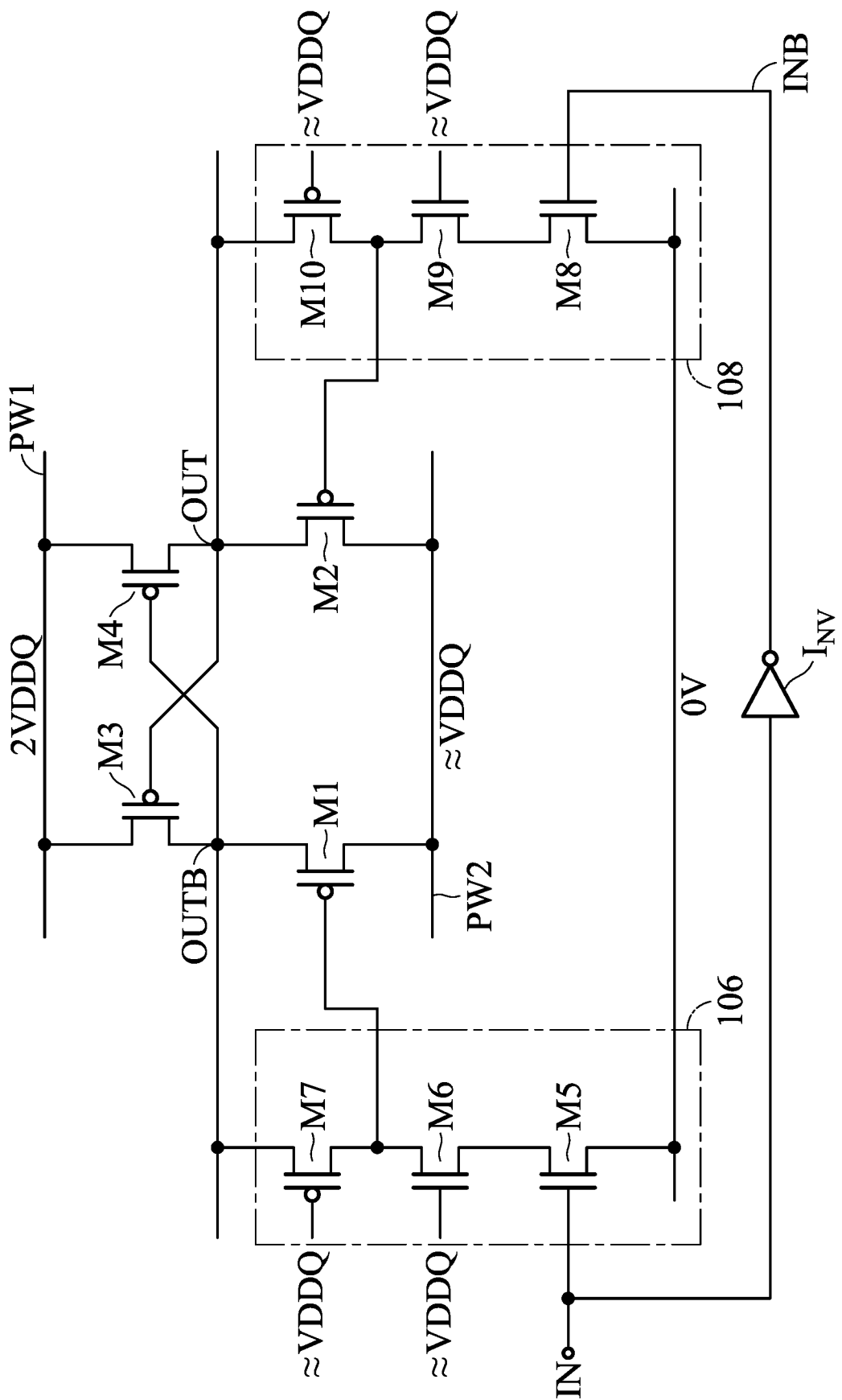
FIG. 2 illustrates the details of the first control circuit 106 and the second control circuit 108 in accordance with an exemplary embodiment of the present invention.

FIG. 2 illustrates the details of the first control circuit 106 and the second control circuit 108 in accordance with an exemplary embodiment of the present invention.

In FIG. 2, the first control circuit 106 has a fifth transistor M5, a sixth transistor M6, and a seventh transistor M7. The fifth transistor M5 is an n-channel metal-oxide semiconductor field-effect transistor (NMOS transistor), having a gate receiving the input signal IN, and a source coupled to the ground (0 volts). The sixth transistor M6 is an NMOS transistor, having a source coupled to the drain of the fifth transistor M5, and a drain coupled to the gate of the first transistor M1. The seventh transistor M7 is a PMOS transistor, having a source coupled to the second output terminal OUTB, and a drain coupled to the gate of the first transistor M1. The gate of the sixth transistor M6 is biased at a third voltage level (≈VDDQ) greater than the ground level (0 volts) and lower than the overdrive level (2VDDQ). The gate of the seventh transistor M7 is biased at a fourth voltage level (≈VDDQ) greater than the ground level (0 volts) and lower than the overdrive level (2VDDQ).

In FIG. 2, the second control circuit 108 has an eighth transistor M8, a ninth transistor M9, and a tenth transistor M10. The eighth transistor M8 is an NMOS transistor, having a gate receiving the inverted input signal INB, and a source coupled to the ground (0 volts). The ninth transistor M9 is an NMOS transistor, having a source coupled to the drain of the eighth transistor M8, and a drain coupled to the gate of the second transistor M2. The tenth transistor M10 is a PMOS transistor, having a source coupled to the first output terminal OUT, and a drain coupled to the gate of the second transistor M2. The gate of the ninth transistor M9 is biased at a third voltage level (≈VDDQ) greater than the ground level (0 volts) and lower than the overdrive level (2VDDQ). The gate of the tenth transistor M10 is biased at a fourth voltage level (≈VDDQ) greater than the ground level (0 volts) and lower than the overdrive level (2VDDQ).

The voltage level applied to the second power terminal PW2 and the voltage levels applied to the gates of the sixth, seventh, ninth and tenth transistors M6, M7, M9 and M10 may be not identical. In an exemplary embodiment, the voltage level applied to the second power terminal PW2 equals the voltage level applied to the gates of the sixth, seventh, ninth and tenth transistors M6, M7, M9 and M10. In another example embodiment, the second power terminal PW2 and the gates of the sixth, seventh, ninth and tenth transistors M6, M7, M9 and M10 all are VDDQ all are biased at a voltage level VDDQ, which is provided by a power source coupled to a former stage that provides the input signal IN to the level shifter.

In some exemplary embodiments, there may be more PMOS transistors coupled between the gate of the first transistor M1 and the second output terminal OUTB, more PMOS transistors coupled between the gate of the second transistor M2 and the first output terminal OUT, more NMOS transistors coupling the gate of the first transistor M1 to the ground, and more NMOS transistors coupling the gate of the second transistor M2 to the ground.

Figure 3:
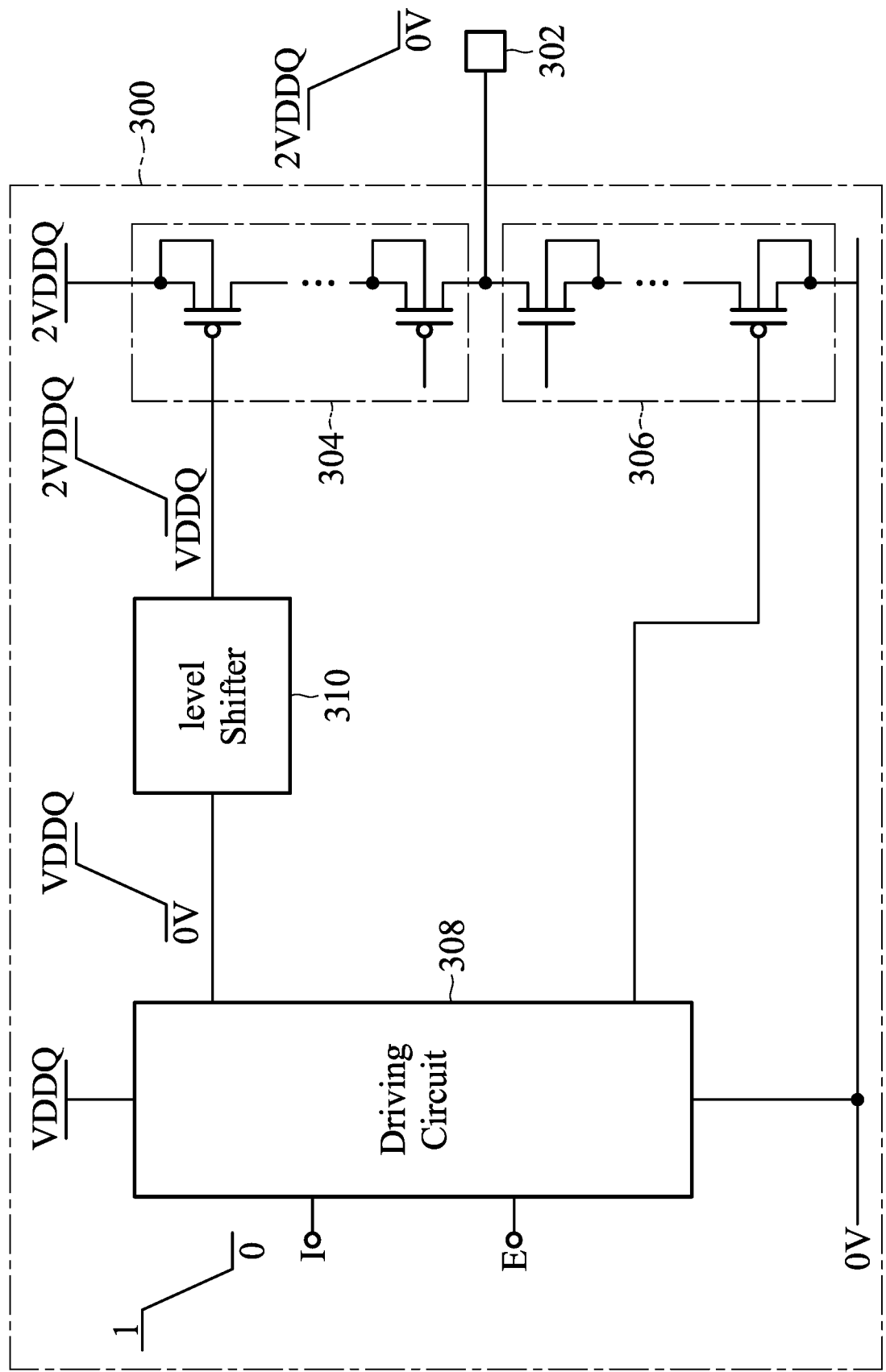
FIG. 3 illustrates an input and output (I/O) buffer 300 in accordance with an exemplary embodiment of the present invention, which is coupled to a pad 302.

FIG. 3 illustrates an input and output (I/O) buffer 300 in accordance with an exemplary embodiment of the present invention, which is coupled to a pad 302. The I/O buffer 300 comprises a pull-up string 304, a pull-down string 306, a driving circuit 308, and a level shifter 310. The power source of the driving circuit 308 is at a voltage level VDDQ. The power source of the pull-up string 304 and the pull-down string 306 is at a voltage level 2VDDQ which is an overdrive voltage. The level shifter 310 is designed according to the forgoing examples. In response to a high to low transition at an input port I of the driving circuit 308, the output of the driving circuit transits from 0 volts to VDDQ. Through the level shifter 310, the signal is shifted to transit from VDDQ to 2VDDQ, a proper voltage range to operate the pull-up string 304. The level shifter 310 is not affected by Vt variations.

Figure 4:
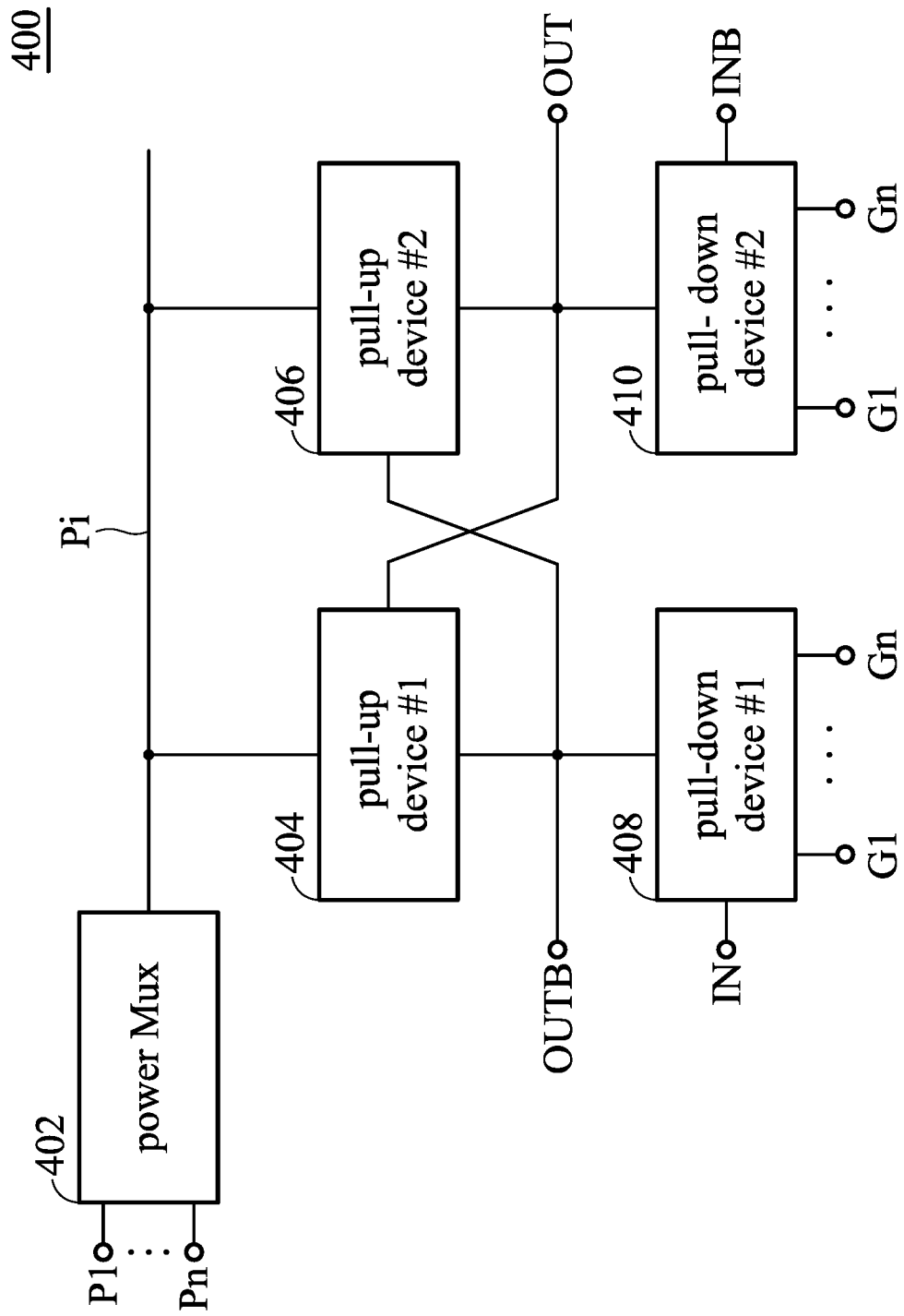
FIG. 4 illustrates a level shifter 400 in accordance with an exemplary embodiment of the present invention.

FIG. 4 illustrates a level shifter 400 in accordance with an exemplary embodiment of the present invention, which includes a power multiplexer 402, a first pull-up device 404, a second pull-up device 406, a first pull-down device 408, and a second pull-down device 410.

The power multiplexer 402 receives a plurality of power voltage candidates P1 . . . . Pn to selectively output a selected power voltage Pi. In response to a low-to-high transition of an input signal IN of the level shifter 400, a first output terminal OUT of the level shifter 400 is pulled up to the selected power voltage Pi by the second pull-up device 406, and the first pull-down device 408 pulls down a second output terminal OUTB of the level shifter 400 to a low-voltage level (Gi, which is one of G1 . . . . Gn) corresponding to the selected power voltage Pi. In response to a high-to-low transition of the input signal IN, the second output terminal OUTB of the level shifter 400 is pulled up to the selected power voltage Pi by the first pull-up device 404, and the second pull-down device 410 pulls down the first output terminal OUT to the low-voltage level Gi corresponding to the selected power voltage Pi.

The first pull-down device 408 and the second pull-down device 410 each includes a plurality of pull-down paths corresponding to the different power voltage candidates P1 . . . . Pn. The different pull-down paths in each pull-down device are established to couple the output terminal OUT/OUTB to the different low-voltage levels G1 . . . . Gn. In response to a selection made through the power multiplexer 402, a pull-down path corresponding to the selected power voltage Pi in each pull-down device is turned on to couple OUT/OUTB to the low-voltage level Gi that is paired with the selected power voltage Pi, and the other pull-down paths (not coupled to Gi) are turned off.

Figure 5A:
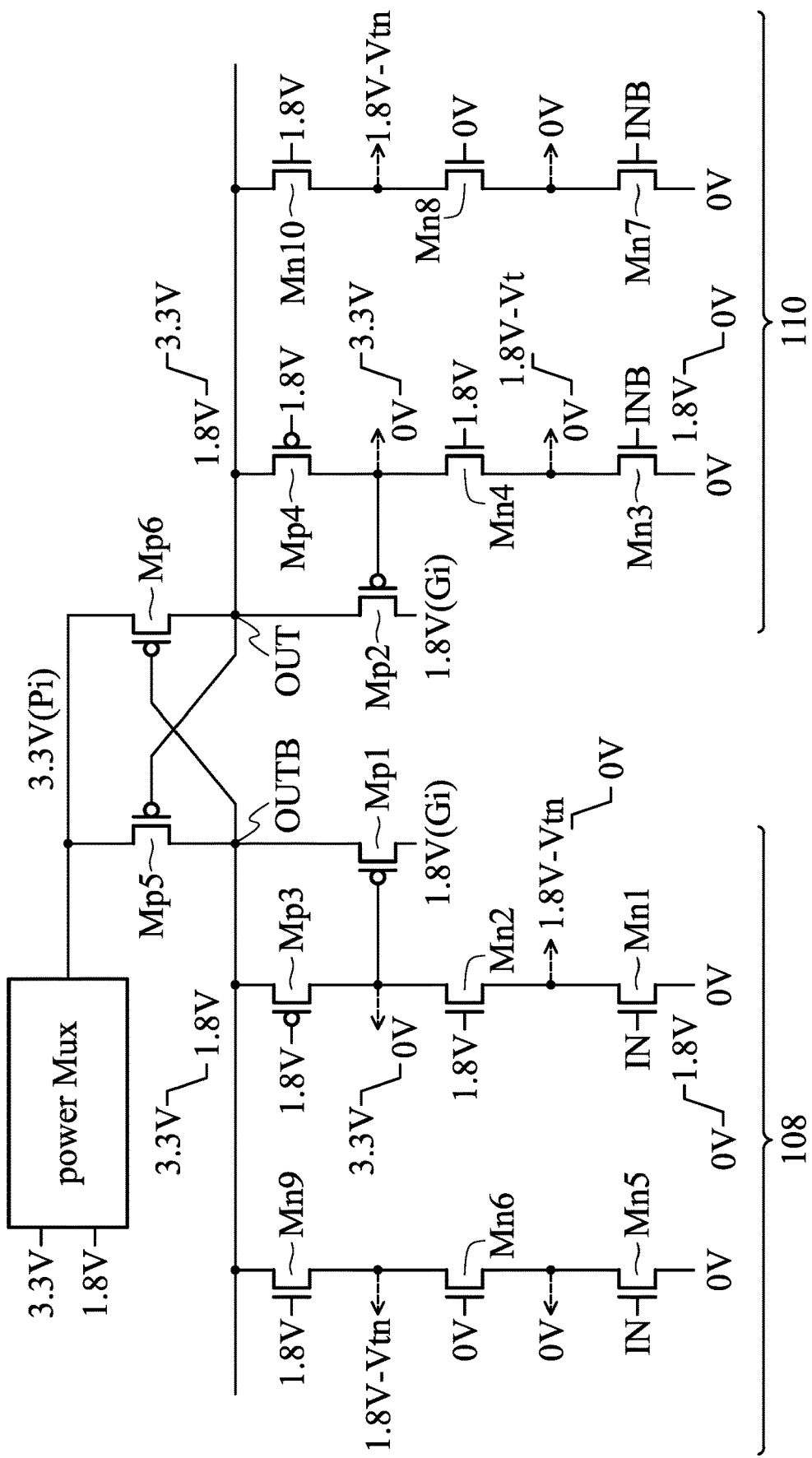
FIG. 5A and FIG. 5B show a level shifter 500 in accordance with an exemplary embodiment of the present invention.
Figure 5B:
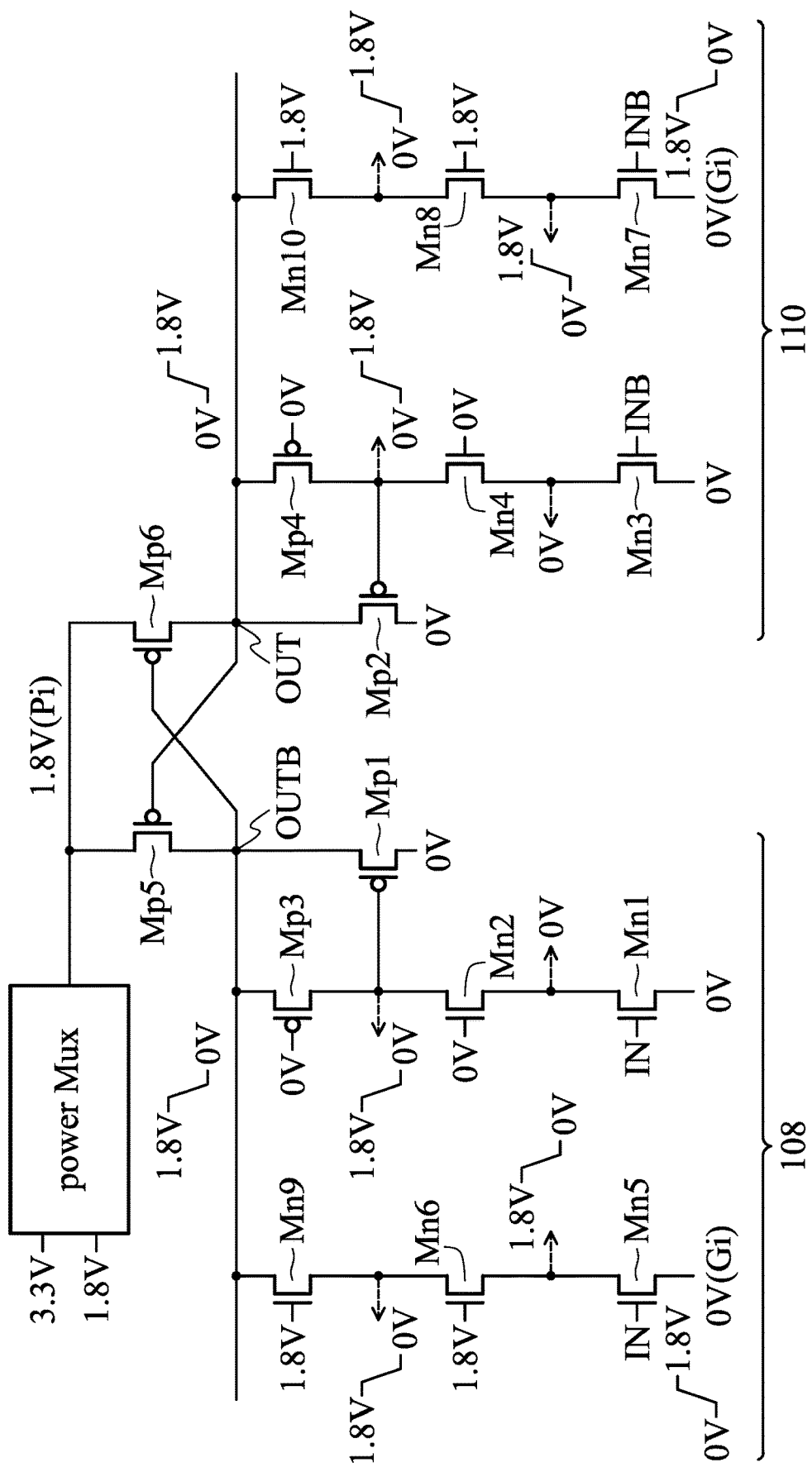

In the following example, the number of power voltage candidates is two, but it is not intended to limit thereto. FIG. 5A and FIG. 5B show a level shifter 500 in accordance with an exemplary embodiment of the present invention. The first power voltage candidate is 3.3V, which corresponds to a first low-voltage level 1.8V. The second power voltage candidate is 1.8V, which corresponds to a second low-voltage level 0V. FIG. 5A shows that the selected power voltage Pi is 3.3V. FIG. 5B shows that the selected power voltage Pi is 1.8V. In this example, the input signal IN is between 0V and 1.8V. Both the second low-voltage level 0V corresponding to the second power voltage candidate 1.8V and the low-voltage level 0V of the input signal IN is the ground level 0V. The second power voltage candidate 1.8V equals the high-voltage level 1.8V of the input signal IN, and is also the same as the first low-voltage level 1.8V corresponding to the first power voltage candidate 3.3V. In some other examples, the voltage levels may have the other design.

Referring to FIG. 5A (Pi is 3.3V and Gi is 1.8V), the level shifter 500 shifts the voltage range from 0V~1.8V to 1.8V~3.3V. The first pull-down device 408 uses a first PMOS (p-channel metal-oxide semiconductor field-effect transistor) transistor Mp1 to build a pull-down path for coupling the second output terminal OUTB to the low-voltage level 1.8V (Gi). The second pull-down device 410 uses a second PMOS transistor Mp2 to build a pull-down path for coupling the first output terminal OUT to the low-voltage level 1.8V (Gi). The first PMOS transistor Mp1 has a source terminal coupled to the second output terminal OUTB and a drain terminal coupled to 1.8V (Gi). The second PMOS transistor Mp2 has a source terminal coupled to the first output terminal OUT and a drain terminal coupled to 1.8V (Gi).

To control the first PMOS transistor Mp1, the first pull-down device 408 further includes a third PMOS transistor Mp3, a first NMOS transistor Mn1, and a second NMOS transistor Mn2. The third PMOS transistor Mp3 has a source terminal coupled to the second output terminal OUTB of the level shifter 500, and a drain terminal coupled to a gate terminal of the first PMOS transistor Mp1. The first NMOS transistor Mn1 has a gate terminal receiving the input signal IN of the level shifter 500 and a source terminal coupled to the ground level 0V. The second NMOS transistor Mn2 has a source terminal coupled to a drain terminal of the first NMOS transistor Mn1, and a drain terminal coupled to the gate terminal of the first PMOS transistor Mp1. To control the second PMOS transistor Mp2, the second pull-down device 410 further includes a fourth PMOS transistor Mp4, a third NMOS transistor Mn3, and a fourth NMOS transistor Mn4. The fourth PMOS transistor Mp4 has a source terminal coupled to the first output terminal OUT of the level shifter 500, and a drain terminal coupled to a gate terminal of the second PMOS transistor Mp2. The third NMOS transistor Mn3 has a gate terminal receiving an inverted signal INB of the input signal IN of the level shifter 500, and a source terminal coupled to the ground level 0V. The fourth NMOS transistor Mn4 has a source terminal coupled to a drain terminal of the third NMOS transistor Mn3, and a drain terminal coupled to the gate terminal of the second PMOS transistor Mp2. In response to the selected power voltage Pi that is the first power voltage candidate 3.3V, a gate terminal of the third PMOS transistor Mp3 and a gate terminal of the fourth PMOS transistor Mp4 are coupled to the first low-voltage level 1.8V, a gate terminal of the second NMOS transistor Mn2 and a gate terminal of the fourth NMOS transistor Mn4 are coupled to the high-voltage level 1.8V of the input signal IN.

In some exemplary embodiments, the number of transistors coupled between the second output terminal OUTB and the gate terminal of Mp1 is not limited to 1, and the number of transistors coupled between the first output terminal OUT and the gate terminal of Mp2 is not limited to 1. In some exemplary embodiments, the number of transistors coupled between the gate terminal of Mp1 and the ground level 0V is not limited to 2, and the number of transistors coupled between the gate terminal of Mp2 and the ground level 0V is not limited to 2.

As shown, the pull-down device 408/410 further includes a pull-down path for the 0V~1.8V design. The first pull-down device 408 includes a fifth NMOS transistor Mn5 and a sixth NMOS transistor Mn6, and the second pull-down device 410 includes a seventh NMOS transistor Mn7 and an eighth NMOS transistor Mn8. The fifth NMOS transistor Mn5 has a gate terminal receiving the input signal IN, and a source terminal coupled to the second low-voltage level 0V. The sixth NMOS transistor Mn6 has a source terminal coupled to a drain terminal of the fifth NMOS transistor Mn5, and a drain terminal coupled to the second output terminal OUTB of the level shifter 500. The seventh NMOS transistor Mn7 has a gate terminal receiving the inverted signal INB of the input signal IN, and a source terminal coupled to the second low-voltage level 0V. The eighth NMOS transistor Mn8 has a source terminal coupled to a drain terminal of the seventh NMOS transistor Mn7, and a drain terminal coupled to the first output terminal OUT of the level shifter 500. In this example, the first pull-down device 408 further includes a ninth NMOS transistor Mn9, and the second pull-down device 410 further includes a tenth NMOS transistor Mn10. The ninth NMOS transistor Mn9 has a source terminal coupled to the drain terminal of the sixth NMOS transistor Mn6, a drain terminal coupled to the second output terminal OUTB of the level shifter 500, and a gate terminal coupled to the first low-voltage level 1.8V. The tenth NMOS transistor Mn10 has a source terminal coupled to the drain terminal of the eighth NMOS transistor Mn8, a drain terminal coupled to the first output terminal OUT of the level shifter 500, and a gate terminal coupled to the first low-voltage level 1.8V.

In some exemplary embodiments, the number of transistors coupled between the second output terminal OUTB and the drain terminal of Mn5 is not limited to 2, and the number of transistors coupled between the first output terminal OUT and the drain terminal of Mn7 is not limited to 2.

Referring to FIG. 5A, the pull-down paths for the 0V~1.8V design should be turned off in 1.8V~3.3V applications. In response to the selected power voltage Pi that is the first power voltage candidate 3.3V, the gate terminal of the sixth NMOS transistor Mn6 and the gate terminal of the eighth NMOS transistor Mn8 are coupled to the second low-voltage level 0V.

Referring to FIG. 5B (Pi is 1.8V and Gi is 0V), the level shifter 500 keeps the voltage range between 0V~1.8V. In 0V~1.8V applications, to really turn off the pull-down paths of the 1.8V~3.3V design, the drain terminal of the first PMOS transistor Mp1 and the drain terminal of the second PMOS transistor Mp2 are coupled to the ground level 0V, the gate terminal of the third PMOS transistor Mp3 and the gate terminal of the fourth PMOS transistor Mp4 are coupled to the second low-voltage level 0V, and the gate terminal of the second NMOS transistor Mn2 and the gate terminal of the fourth NMOS transistor Mn4 are coupled to the ground level 0V. To turn on the pull-down paths of the 0V~1.8V design, a gate terminal of the sixth NMOS transistor Mn6 and a gate terminal of the eighth NMOS transistor Mn8 are coupled to the high-voltage level 1.8V of the input signal IN.

Any level shifter with the transistors Mn5~Mn10 should be considered within the scope of the present invention. In the other embodiments, the second power candidate is not limited to the high-voltage level of the input signal IN.

The cross-coupled output pair in the level shifter is discussed in this paragraph. The first pull-up device 404 includes a fifth PMOS transistor Mp5, having a source terminal coupled to the selected power voltage Pi, a drain terminal coupled to the second output terminal OUTB of the level shifter, and a gate terminal coupled to the first output terminal OUT of the level shifter. The second pull-up device 406 includes a sixth PMOS transistor Mp6, having a source terminal coupled to the selected power voltage Pi, a drain terminal coupled to the first output terminal OUT of the level shifter, and a gate terminal coupled to the second output terminal OUTB of the level shifter.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A level shifter, comprising:
a power multiplexer, receiving a plurality of power voltage candidates to selectively output a selected power voltage;
a first pull-up device and a second pull-up device; and
a first pull-down device and a second pull-down device;
wherein:
in response to a low-to-high transition of an input signal of the level shifter, a first output terminal of the level shifter is pulled up to the selected power voltage by the second pull-up device, and the first pull-down device pulls down a second output terminal of the level shifter to a low-voltage level corresponding to the selected power voltage;

in response to a high-to-low transition of the input signal of the level shifter, the second output terminal of the level shifter is pulled up to the selected power voltage by the first pull-up device, and the second pull-down device pulls down the first output terminal of the level shifter to the low-voltage level corresponding to the selected power voltage;

each pull-down device includes a plurality of pull-down paths corresponding to the different power voltage candidates; and in response to a selection made through the power multiplexer, a pull-down path corresponding to the selected power voltage in each pull-down device is turned on and the other pull-down paths are turned off.

2. The level shifter as claimed in claim 1, wherein:
a first power voltage candidate is greater than a second power voltage candidate; and
a first low-voltage level corresponding to the first power voltage candidate is greater than a second low-voltage level corresponding to the second power voltage candidate.

3. The level shifter as claimed in claim 2, wherein:
the first pull-down device includes a first PMOS transistor, wherein the first PMOS transistor has a source terminal coupled to the second output terminal of the level shifter and, in response to the selected power voltage that is the first power voltage candidate, a drain terminal of the first PMOS transistor is coupled to the first low-voltage level; and
the second pull-down device includes a second PMOS transistor, wherein the second PMOS transistor has a source terminal coupled to the first output terminal of the level shifter and, in response to the selected power voltage that is the first power voltage candidate, a drain terminal of the second PMOS transistor is coupled to the first low-voltage level.

4. The level shifter as claimed in claim 3, wherein:
the first pull-down device further includes a third PMOS transistor, wherein the third PMOS transistor has a source terminal coupled to the second output terminal of the level shifter, and a drain terminal coupled to a gate terminal of the first PMOS transistor;
the second pull-down device further includes a fourth PMOS transistor, wherein the fourth PMOS transistor has a source terminal coupled to the first output terminal of the level shifter, and a drain terminal coupled to a gate terminal of the second PMOS transistor; and
in response to the selected power voltage that is the first power voltage candidate, a gate terminal of the third PMOS transistor and a gate terminal of the fourth PMOS transistor are coupled to the first low-voltage level.

5. The level shifter as claimed in claim 4, wherein:
the first pull-down device further includes a first NMOS transistor and a second NMOS transistor, wherein the first NMOS transistor has a gate terminal receiving the input signal of the level shifter and a source terminal coupled to a ground level, and the second NMOS transistor has a source terminal coupled to a drain terminal of the first NMOS transistor and a drain terminal coupled to the gate terminal of the first PMOS transistor;
the second pull-down device further includes a third NMOS transistor and a fourth NMOS transistor, wherein the third NMOS transistor has a gate terminal receiving an inverted signal of the input signal of the level shifter and a source terminal coupled to the ground level, and the fourth NMOS transistor has a source terminal coupled to a drain terminal of the third NMOS transistor and a drain terminal coupled to the gate terminal of the second PMOS transistor; and in response to the selected power voltage that is the first power voltage candidate, a gate terminal of the second NMOS transistor and a gate terminal of the fourth NMOS transistor are coupled to a high-voltage level of the input signal.

6. The level shifter as claimed in claim 5, wherein:
in response to the selected power voltage that is the second power voltage candidate, the drain terminal of the first PMOS transistor and the drain terminal of the second PMOS transistor are coupled to the ground level, the gate terminal of the third PMOS transistor and the gate terminal of the fourth PMOS transistor are coupled to the second low-voltage level, and the gate terminal of the second NMOS transistor and the gate terminal of the fourth NMOS transistor are coupled to the ground level.

7. The level shifter as claimed in claim 6, wherein:
the first pull-down device further includes a fifth NMOS transistor and a sixth NMOS transistor, wherein the fifth NMOS transistor has a gate terminal receiving the input signal and a source terminal coupled to the second low-voltage level, and the sixth NMOS transistor has a source terminal coupled to a drain terminal of the fifth NMOS transistor and a drain terminal coupled to the second output terminal of the level shifter;
the second pull-down device further includes a seventh NMOS transistor and an eighth NMOS transistor, wherein the seventh NMOS transistor has a gate terminal receiving the inverted signal of the input signal and a source terminal coupled to the second low-voltage level, and the eighth NMOS transistor has a source terminal coupled to a drain terminal of the seventh NMOS transistor and a drain terminal coupled to the first output terminal of the level shifter; and
in response to the selected power voltage that is the second power voltage candidate, a gate terminal of the sixth NMOS transistor and a gate terminal of the eighth NMOS transistor are coupled to the high-voltage level of the input signal.

8. The level shifter as claimed in claim 7, wherein:
in response to the selected power voltage that is the first power voltage candidate, the gate terminal of the sixth NMOS transistor and the gate terminal of the eighth NMOS transistor are coupled to the second low-voltage level.

9. The level shifter as claimed in claim 8, wherein:
the first pull-down device further includes a ninth NMOS transistor, wherein the ninth NMOS transistor has a source terminal coupled to the drain terminal of the sixth NMOS transistor, a drain terminal coupled to the second output terminal of the level shifter, and a gate terminal coupled to the first low-voltage level; and
the second pull-down device further includes a tenth NMOS transistor, wherein the tenth NMOS transistor has a source terminal coupled to the drain terminal of the eighth NMOS transistor, a drain terminal coupled to the first output terminal of the level shifter, and a gate terminal coupled to the first low-voltage level.

10. The level shifter as claimed in claim 9, wherein:
the second low-voltage level equals the ground level that is also a low-voltage level of the input signal.

11. The level shifter as claimed in claim 10, wherein:
the second power voltage candidate equals the high-voltage level of the input signal.

12. The level shifter as claimed in claim 11, wherein:
the first low-voltage level equals the second power voltage candidate.

13. The level shifter as claimed in claim 1, wherein:
the first pull-up device includes a first pull-up PMOS transistor, having a source terminal coupled to the selected power voltage, a drain terminal coupled to the second output terminal of the level shifter, and a gate terminal coupled to the first output terminal of the level shifter; and
the second pull-up device includes a second pull-up PMOS transistor, having a source terminal coupled to the selected power voltage, a drain terminal coupled to the first output terminal of the level shifter, and a gate terminal coupled to the second output terminal of the level shifter.

14. The level shifter as claimed in claim 2, wherein:
the first pull-down device includes a first pull-down NMOS transistor and a second pull-down NMOS transistor, wherein the fifth first pull-down NMOS transistor has a gate terminal receiving the input signal of the level shifter and a source terminal coupled to the second low-voltage level, and the second pull-down NMOS transistor has a source terminal coupled to a drain terminal of the first pull-down NMOS transistor and a drain terminal coupled to the second output terminal of the level shifter;
the second pull-down device includes a third pull-down NMOS transistor and a fourth pull-down NMOS transistor, wherein the third pull-down NMOS transistor has a gate terminal receiving an inverted signal of the input signal and a source terminal coupled to the second low-voltage level, and the fourth pull-down NMOS transistor has a source terminal coupled to a drain terminal of the third pull-down NMOS transistor and a drain terminal coupled to the first output terminal of the level shifter; and
in response to the selected power voltage that is the second power voltage candidate, a gate terminal of the second pull-down NMOS transistor and a gate terminal of the fourth pull-down NMOS transistor are coupled to a high-voltage level of the input signal.

15. The level shifter as claimed in claim 14, wherein:
in response to the selected power voltage that is the first power voltage candidate, the gate terminal of the second pull-down NMOS transistor and the gate terminal of the fourth pull-down NMOS transistor are coupled to the second low-voltage level.

16. The level shifter as claimed in claim 15, wherein:
the first pull-down device further includes a fifth pull-down NMOS transistor, wherein the fifth pull-down NMOS transistor has a source terminal coupled to the drain terminal of the second pull-down NMOS transistor, a drain terminal coupled to the second output terminal of the level shifter, and a gate terminal coupled to the first low-voltage level; and
the second pull-down device further includes a sixth pull-down NMOS transistor, wherein the sixth pull-down NMOS transistor has a source terminal coupled to the drain terminal of the fourth pull-down NMOS transistor, a drain terminal coupled to the first output terminal of the level shifter, and a gate terminal coupled to the first low-voltage level.

\* \* \* \* \*